US006300228B1

(12) United States Patent
Adkisson et al.

(10) Patent No.: US 6,300,228 B1
(45) Date of Patent: Oct. 9, 2001

(54) MULTIPLE PRECIPITATION DOPING PROCESS

(75) Inventors: James W. Adkisson, Jericho; James A. Bruce, Williston; John J. Ellis-Monaghan, Grand Isle; Randy W. Mann, Jericho; Edward J. Nowak; Kirk D. Peterson, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/386,089

(22) Filed: Aug. 30, 1999

(51) Int. Cl.[7] ................................................. H01L 21/22
(52) U.S. Cl. ........................ 438/558; 438/560; 438/563; 438/151; 438/535; 438/565; 438/478; 427/526
(58) Field of Search ................................... 438/558, 478, 438/560, 563, 535, 565, 301

(56) References Cited

U.S. PATENT DOCUMENTS

| | | | |
|---|---|---|---|
| 3,764,412 | * 10/1973 | Muller | 438/178 |
| 3,880,682 | * 4/1975 | Muller | 438/178 |
| 4,343,832 | 8/1982 | Smith et al. | 427/53.1 |
| 5,316,969 | 5/1994 | Ishida et al. | 437/168 |
| 5,386,798 | 2/1995 | Lowndes et al. | 117/50 |
| 5,541,138 | * 7/1996 | Yamazaki et al. | 438/550 |
| 5,569,624 | * 10/1996 | Weiner | 438/285 |
| 5,599,735 | 2/1997 | Moslehi | 437/165 |
| 5,602,047 | 2/1997 | Tsai et al. | 437/41 |
| 5,696,011 | 12/1997 | Yamazaki et al. | 437/40 |
| 5,879,969 | * 3/1999 | Yamazaki et al. | 438/151 |
| 6,040,019 | * 3/2000 | Ishida | 427/526 |

FOREIGN PATENT DOCUMENTS 93315556   5/1992   (JP).

OTHER PUBLICATIONS

Carey, P. G., A Shallow Junction Submicrometet PMOS Process Without High–Temperature Anneals, IEEE Electron Device Letters, vol. 9, No. 10, Oct. 1998.*
Carey, P. G., Fabrication of Submicrometer MOSFET's Using Gas Immersion Laser Doping (GILD), IEEE Electron Devices Letters, vol., EDL 7, No. 7, Jul. 1986.*
JPO & JAPIO Abstract, "Manufacture of Complementary–Type MOS Semiconductor Device", 1998.
JPO & JAPIO Abstract, "Thin–Film Transistor", 1998.

* cited by examiner

*Primary Examiner*—Matthew Smith
*Assistant Examiner*—B. V. Keshavan
(74) *Attorney, Agent, or Firm*—Schmeiser, Olsen & Watts; William D. Sabo

(57) ABSTRACT

A multiple precipitation doping process for doping a semiconductor substrate (30) starts with forming an amorphous region (32) in the substrate (30). Through multiple laser exposures, multiple dopant precipitation films (52, 53) are formed on corresponding portions (34, 37) of the major surface (31) of the substrate (30) overlying the amorphous region (32). The substrate (30) is then annealed. The annealing process melts the amorphous region (32) and allows the dopants precipitated on the major surface (31) to diffuse into the substrate (30). The annealing process also crystallizes the semiconductor material the amorphous region (32). The substrate (30) becomes a single crystal semiconductor substrate with multiple doped regions (54, 57) therein. The depth of the doped regions (54, 57) is substantially equal to the depth of the amorphous region (32) before annealing.

30 Claims, 4 Drawing Sheets

MULTIPLE PRECIPITATION DOPING PROCESS

FIELD OF THE INVENTION

The present invention relates, in general, to semiconductor device fabrication and, more particularly, to doping processes in the fabrication of semiconductor devices.

BACKGROUND OF THE INVENTION

Semiconductor device fabrication processes typically include the introduction of dopants into a semiconductor substrate to form device junctions in the semiconductor substrate. Because of its superior controllability and processing throughput, ion implantation is one of the most widely used processes for introducing dopants into the semiconductor substrate. An ion implantation process typically includes depositing a photoresist on the semiconductor substrate, exposing the photoresist using a mask, developing the photoresist to produce the desired lithographic pattern, and implanting ions into the semiconductor substrate through the photoresist pattern.

A semiconductor device fabrication process usually includes several doping processes. The photoresist masks in different ion implantation processes should align with each other. In state of art semiconductor devices, the tolerance for the misalignment between different photoresist masks is very small, typically less than 0.1 micrometer. Accurately aligning photoresist masks with each other is complicated and time consuming. Further, the ion implantation processes are unsuitable for forming shallow junctions, e.g., junctions having depths less than 100 nanometers, and high dopant density which are often essential for submicron semiconductor devices to achieve high performances in terms of contact resistance, sheet resistance, and junction leakage current.

Accordingly, it would be advantageous to have a doping process capable of forming multiple doped regions accurately aligned with each other in a semiconductor substrate. It is desirable if the doping process can be performed without the complicated inefficient steps of depositing, developing, and stripping photoresist. It is also desirable for the doping process to be capable of forming shallow junctions with high dopant densities in the semiconductor substrate. It would be of further advantage for the doping process to be compatible with the fabrication of high performance submicron semiconductor devices.

SUMMARY OF THE INVENTION

A general object of-the present invention is to provide a doping process suitable for fabricating high performance submicron semiconductor devices. It is a further object of the present invention to provide the doping process capable of forming multiple doped regions in a semiconductor substrate with high alignment accuracy. Another object of the present invention is to perform the doping process without depositing and developing photoresist. It is an additional object of the present invention for the doping process to be capable of forming shallow junctions in the semiconductor substrate.

These and other objects of the present invention are accomplished through a multiple precipitation doping process. The multiple precipitation doping process includes precipitating different dopants onto corresponding portions of the major surface of the semiconductor substrate. Preferably, patterned laser beams are used to precipitate the dopants onto the major surface of the semiconductor substrate, thereby eliminating the need for photoresist masks in the doping process. The patterned laser beams determine the patterns and the alignments of the doped regions. The precipitation rate and duration determine the surface dopant concentration and junction depths in the semiconductor substrate.

In a preferred embodiment, the multiple precipitation process of the present invention includes steps of forming an amorphous region partially extending into a single crystal semiconductor substrate; precipitating different dopants onto corresponding portions of the major surface of the semiconductor substrate overlying the amorphous region; and annealing the amorphous region. The annealing process melts the amorphous region and allows the dopants precipitated on the semiconductor major surface to diffuse into the semiconductor substrate. Preferably, the temperature and the duration of the annealing process are adjusted so that the dopant diffusions stop at the interface between amorphous region and the underlying single crystal region. The annealing process also crystallizes the semiconductor material in the amorphous region. Therefore, the semiconductor substrate becomes a single crystal semiconductor substrate with multiple doped regions therein. The depth of the doped regions is substantially equal to the depth of the amorphous region before annealing. The depth of the amorphous region determines the junction depth of the doped regions.

DETAILED DESCRIPTION OF THE PREFERRED EMBODIMENTS

Figure 1:
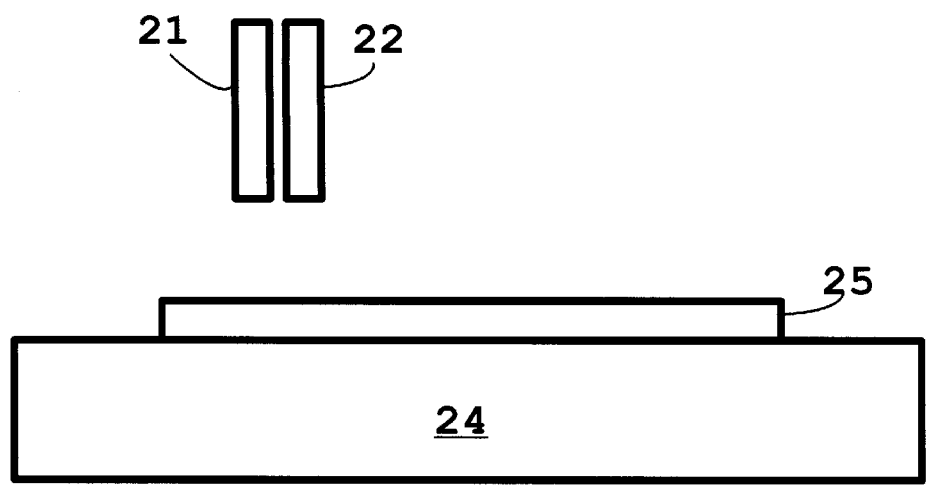
FIG. 1 schematically shows an apparatus suitable for use in doping processes of the present invention.

Preferred embodiments of the present invention are described in detail herein below with reference to the figures. It should be noted that the figures are not necessarily drawn to scale. It should also be noted that elements having similar are labeled using the same reference numerals in the figures.

FIG. 1 is a schematic diagram of an apparatus 20 suitable for use in doping processes of the present invention. Apparatus 20 includes a laser source 21 and a laser source 22 adjacent to each other and substantially parallel to each other. By way of example, the laser beams emitted from laser sources 21 and 22 are in the visible light or ultraviolet ranges. In a preferred embodiment, laser source 21 is an arsenic fluoride excimer laser source emitting a laser beam having a wavelength of approximately 193 nanometers (nm), and laser source 22 emits a laser beam having a wavelength of approximately 308 nm. Apparatus 20 also includes a wafer platform 24. During a doping process, a semiconductor wafer 25 is placed on wafer platform 24. Preferably, wafer platform 24 has a wafer securing mechanism (not shown) such as, for example, a vacuum chuck system to secure semiconductor wafer 25. In addition, wafer platform 24 is preferably substantially perpendicular to the laser beams emitted from laser sources 21 and 22. Laser sources 21 and 22 are movable relative to wafer platform 24 in a plane substantially parallel to wafer platform 24. A chamber or a compartment (not shown) encloses at least a portion of apparatus 20 surrounding wafer platform 24. The chamber can be filled with a dopant containing gas, thereby immersing semiconductor wafer 25 in an environment of the dopant containing gas.

Figure 2:
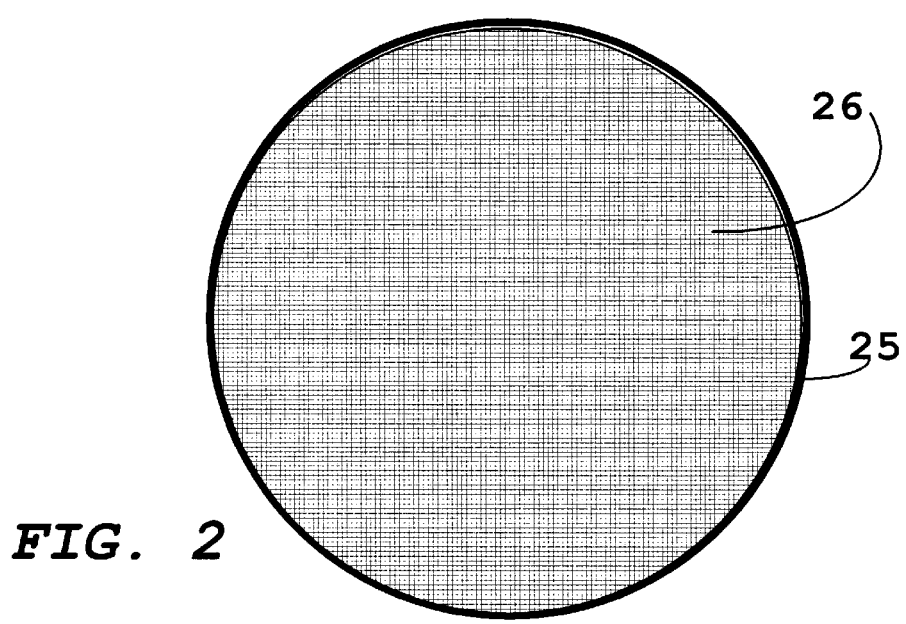
FIG. 2 is a top view of a semiconductor wafer that can be doped using the doping processes of the present invention.

Referring now to FIG. 2, which is a top view of semiconductor wafer 25. By way of example, semiconductor wafer 25 is a single crystal silicon wafer. Semiconductor wafer 25 can also be a single crystal germanium wafer, a silicon-germanium wafer, a silicon carbide wafer, etc. Semiconductor wafer 25 contains a plurality of dies arranged in rows and columns. Die 26 is a representative die on semiconductor wafer 25.

In a process of using apparatus 20 of FIG. 1 to dope semiconductor wafer 25, laser sources 21 and 22 are aligned sequentially to different dies on semiconductor wafer 25 on wafer platform 24. The motion of laser sources 21 and 22 from a position aligned to one die to a next position aligned to a subsequent die on semiconductor wafer 25 is referred to as a step. Apparatus 20 is also referred to as a stepper. A doping process using apparatus 20 to form multiple doped regions on semiconductor wafer 25 is referred to as a multiple precipitation doping process or a multiple exposure projection gas immersion laser doping (PGILD) process.

Figure 3:
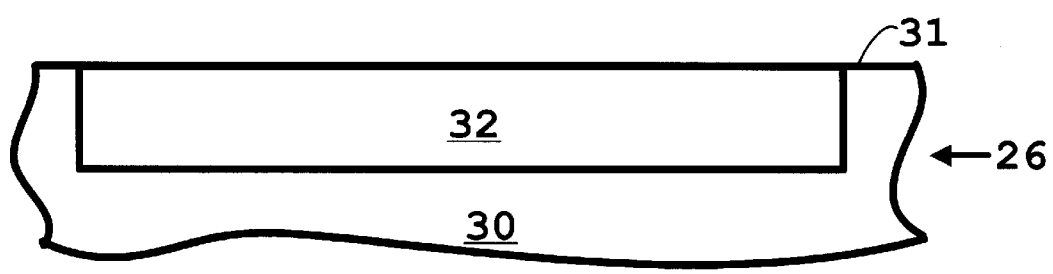
FIG. 3 is a cross sectional view of a semiconductor substrate at an early stage of the doping processes in accordance with the present invention.

FIG. 3 is a cross sectional view of a semiconductor substrate 30. FIG. 3 shows semiconductor substrate 30 as a portion of a die, e.g., die 26, in semiconductor wafer 25 shown in FIG. 2. A portion of the front surface of semiconductor wafer 25 is represented as a major surface 31 of semiconductor substrate 30 in FIG. 3. Furthermore, FIG. 3 shows semiconductor substrate 30 at an early stage of the multiple precipitation doping processes in accordance with the present invention. A first step of the doping processes is to form an amorphous region 32 in semiconductor substrate 30. Amorphous region 32 extends from major surface 31 partially into semiconductor substrate 30. By way of example, amorphous region 32 is formed by implanting silicon ions into semiconductor substrate 30. The depth of amorphous region 32 depends on the dose and energy of the implanted silicon ions. In a preferred embodiment, the dose of the ion implantation is between approximately $5 \times 10^{14}$ ions per square centimeter (ions/cm$^2$) and approximately $1 \times 10^{15}$ ions/cm$^2$, and the energy of the ions is between approximately 10 kilo-electron-volts (keV) and approximately 70 keV. Preferably, the ion implantation process that forms amorphous region 32 in semiconductor substrate 30 also forms amorphous regions in other dies in semiconductor wafer 25. In subsequent steps of the doping processes, doped regions are formed in amorphous region 32. For simplicity, only the processes of forming two doped regions in amorphous region 32 are described infra. However, this is not intended as a limitation of the present invention. Any number of doped regions such as, for example, one, three, four, five, etc., can be formed in amorphous region 32 using processes similar to those described infra. Different doped regions in substrate 30 can have the same conductivity type as each other or opposite conductivity types from each other. They may have either substantially the same or different dopant densities.

A multiple precipitation doping processes in accordance with a first embodiment of the present invention is described herein with reference to FIGS. 4–7. After forming amorphous regions, e.g., amorphous region 32, in the dies, e.g., die 26, in semiconductor wafer 25 as described supra with reference to FIG. 3, semiconductor wafer 25 is placed on wafer platform 24 in apparatus 20 shown in FIG. 1.

Figure 4:
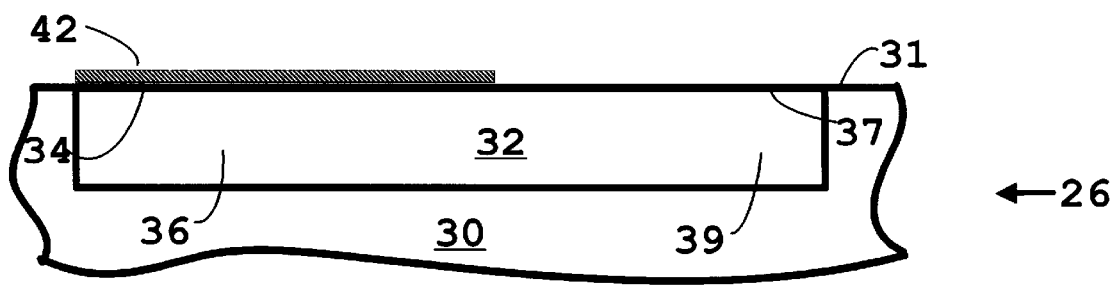
FIGS. 4–7 illustrate the semiconductor substrate at various stages in a multiple cipitation doping processes in accordance with the present invention.
Figure 5:
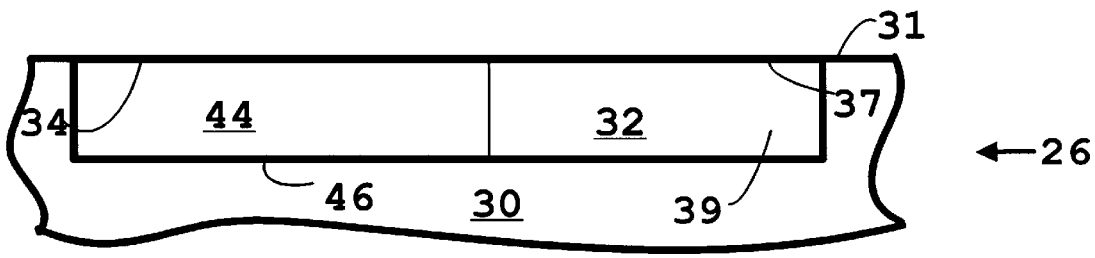
Figure 6:
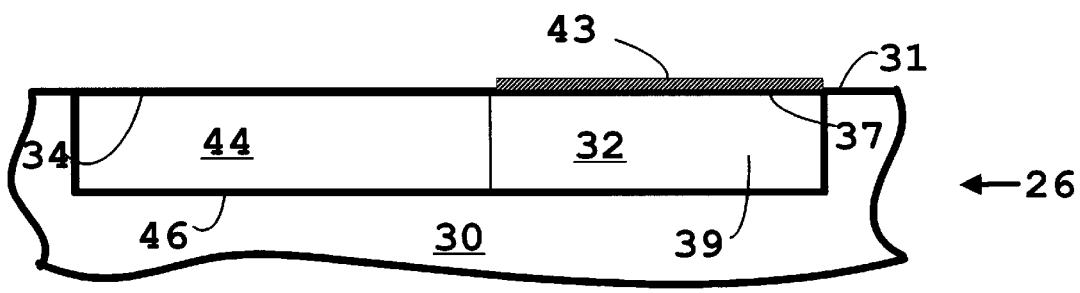

Laser sources 21 and 22 are aligned to a first die, e.g., die 26, in semiconductor wafer 25. A set of reticles (not shown) are used to mask laser sources 21 and 22. The reticles have a first pattern matching that of a first doped region to be formed in substrate 30. The chamber (not shown) enclosing wafer platform 24 is filled with a gas containing a first dopant, e.g., a dopant of N conductivity type. Typically, the gas also contains an inert component, e.g., nitrogen, helium, etc. The inert component is also referred to as a carrier gas. Laser source 21 is switched on to illuminate die 26 while semiconductor wafer 25 is immersed in the first dopant containing gas. By way of example, laser source 21 emits a pulsating laser beam having a wavelength of approximately 193 nm. The pulsating frequency of the laser beam ranges between approximately 50 Hertz (Hz) and approximately 100 Hz, with each pulse having a width of approximately 10 nanoseconds (ns). Because laser source 21 is masked with the first pattern, the laser beam emitted from laser source 21 only illuminates a portion 34 of major surface 31 of semiconductor substrate 30. Portion 34 of major surface 31 overlies a portion 36 of amorphous region 32. The laser beam causes the N type dopant in the dopant containing gas to precipitate onto portion 34 of major surface 31, thereby forming a first dopant precipitation region or film 42 over portion 34 of major surface 31, as shown in FIG. 4. The surface dopant concentration and film thickness of dopant precipitation film 42 depends on the concentration of the dopant in the gas, the wavelength and intensity of the laser beam emitted from laser source 21, and the duration of the laser exposure. When a desired surface dopant deposition is achieved, laser source 21 is switched off. The chamber (not shown) enclosing semiconductor wafer 25 and wafer platform 24 is cleared of the first dopant containing gas. In one embodiment, the first dopant containing gas is extracted out of the chamber using a vacuum pump (not shown). In another embodiment, an inert gas, e.g., nitrogen, helium, etc., is pumped into the chamber to displace the first dopant containing gas. During the precipitation process, the temperature of semiconductor wafer 25 on wafer platform 24 is preferably between approximately 20 degrees Celsius (°C.) and approximately 500° C. in order to promote optimum precipitation characteristics without recrystallizing amorphous region 32.

In a preferred embodiment, dopant precipitation film 42 is a dopant containing silicate glass layer. To form dopant containing silicate glass layer 42, the chamber (not shown) enclosing wafer platform 24 is connected to three gas lines. The first gas line feeds the chamber with nitrous oxide ($N_2O$). The second gas line feeds the chamber with a mixture of approximately 5 percent (%) silane ($Si_2H_6$) and approximately 95% ($N_2$). The third gas line feeds the chamber with a dopant gas. For example, if phosphorus is to be doped into portion 36, the third gas line feeds phosphine ($PH_3$) into the chamber and dopant precipitation film 42 is formed as a phosphorus silicate glass layer. On the other hand, if arsenic is to be doped into portion 36, the third gas line feeds arsine ($AsH_3$) into the chamber and dopant precipitation film 42 is formed as a arsenic silicate glass layer.

Laser source 22 is switched on to illuminate die 26 with a laser beam having a wavelength of approximately 308 nm.

Because laser source 22 is masked with the first pattern, the laser beam emitted from laser source 22 only illuminates portion 34 of major surface 31. The laser beam anneals portion 36 of amorphous region 32 and causes the N type dopant in dopant precipitation film 42 to diffuse into portion 36 of amorphous region 32. The diffusion depth depends on the wavelength, intensity, and time duration of the laser beam emitted from laser source 22. Preferably, the diffusion depth is substantially equal to the depth of amorphous region 32. In other words, the diffusion of the N type dopant preferably propagates to an interface between portion 36 of amorphous region 32 and the underlying single crystal silicon portion of semiconductor substrate 30. This is easily achievable because amorphous silicon has a significantly lower melting point than single crystal silicon. After annealing, the silicon in portion 36 of amorphous region 32 crystallizes to form an N type doped single crystal silicon region 44 shown in FIG. 5. An interface 46 between N type doped region 44 and underlying semiconductor substantially coincides with the interface between portion 36 of amorphous region 32 and the underlying single crystal silicon region before the annealing.

Another set of reticles (not shown) with a second pattern replace the reticles with the first pattern and mask laser sources 21 and 22, which are still aligned to die 26 on semiconductor wafer 25. The second pattern matches the pattern of a second doped region to be formed in semiconductor substrate 30. The chamber (not shown) enclosing wafer platform 24 is filled with a gas containing a second dopant, e.g., a dopant of P conductivity type. Like the first dopant containing gas, the second dopant containing gas typically also contains an inert carrier gas component. Laser source 21 is switched on to illuminate die 26 while semiconductor wafer 25 is immersed in the second dopant containing gas. Because laser source 21 is masked with the second pattern, only a portion 37 of major surface 31 of semiconductor substrate 30 is exposed to the laser beam emitted from laser source 21. Portion 37 of major surface 31 overlies a portion 39 of amorphous region 32. It should be noted that portion 39 is still amorphous. The laser beam causes the P type dopant in the dopant containing gas to precipitate onto portion 37 of major surface 31, thereby forming a second dopant precipitation region or film 43 over portion 37 of major surface 31 shown in FIG. 6. The surface dopant concentration and film thickness of dopant precipitation film 43 depends on the concentration of the dopant in the gas, the wavelength and intensity of the laser beam emitted from laser source 21, and the time duration of the illumination. When a desired surface dopant deposition is achieved, laser source 21 is switched off. The second dopant containing gas is purged from the chamber (not shown) enclosing semiconductor wafer 25 and wafer platform 24. This can be achieved by pumping the second dopant containing gas out of the chamber using a vacuum pump (not shown), pumping an inert gas into the chamber to displace the second dopant containing gas, or a combination of both.

Like dopant precipitation film 42, dopant precipitation film 43 is preferably a dopant containing silicate glass layer. For example, if boron is to be doped into portion 39 of amorphous region 32. The chamber (not shown) enclosing wafer platform 24 is fed with nitrous oxide, a mixture of silane and nitrogen, and diborane ($B_2H_6$). Thus, the precipitation process forms a boron silicate glass layer as dopant precipitation film 43.

Figure 7:
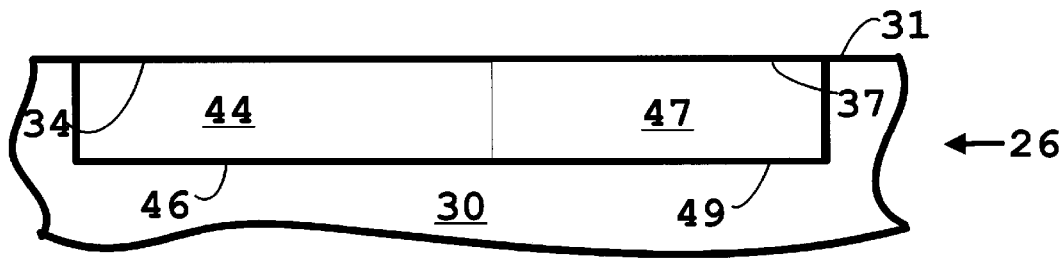

Laser source 22 is switched on to illuminate die 26. Because laser source 22 is masked with the second pattern, only portion 37 of major surface 31 of semiconductor substrate 30 is exposed to the laser beam emitted from laser source 22. The laser beam anneals portion 39 of amorphous region 32 and causes the P type dopant in dopant precipitation film 43 to diffuse into portion 39 of amorphous region 32. Preferably, the diffusion of the P type dopant propagates to an interface between portion 39 of amorphous region 32 and the underlying single crystal silicon portion of semiconductor substrate 30. This is easily achievable because of significantly different melting temperatures between amorphous silicon and single crystal silicon. The annealing process causes the amorphous silicon in portion 39 of amorphous region 32 to crystallize, thereby forming a P type doped single crystal silicon region 47, as shown in FIG. 7. An interface 49 between P type doped region 47 and underlying semiconductor coincides with the interface between portion 39 of amorphous region 32 and the underlying single crystal silicon region before the annealing.

After forming N type doped region 44 and P type doped region 47 in semiconductor 30, laser sources 21 and 22 move to a new position aligned to a subsequent die in semiconductor wafer 25. This motion of laser sources 21 and 22 with respect to semiconductor wafer 25 is referred to as a step. In other words, laser sources 21 and 22 step to the subsequent die in semiconductor wafer 25. The N type dopant precipitation and diffusion, and the P type dopant precipitation and diffusion repeat with respect to the subsequent die to form corresponding N type and P type doped regions in that subsequent die. These stepping, precipitating, diffusion, precipitating, and diffusion actions continue, thereby forming N type doped P type doped regions in a plurality of dies in semiconductor wafer 25.

During the process of forming multiple doped regions in a die, e.g., N type doped region 44 and P type doped region 47 in die 26 shown in FIG. 7, laser sources 21 and 22 do not move with respect to semiconductor wafer 25. In other words, the multiple doped regions in a die are formed within a single step of apparatus 20. Consequently, the alignment mismatch between different doped regions in the die is substantially eliminated.

Figure 8:
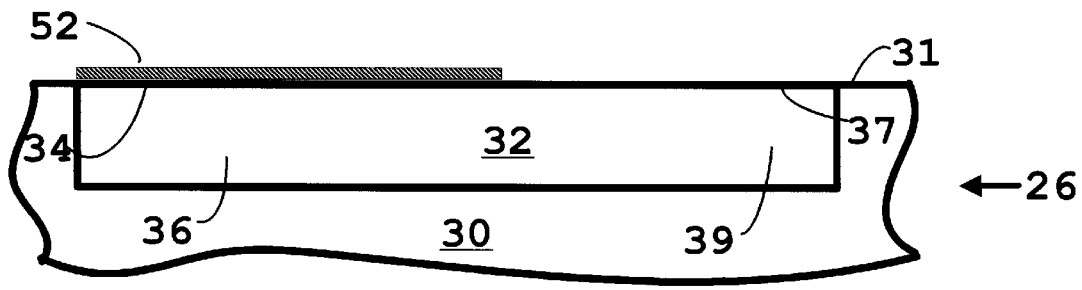
FIGS. 8–10 illustrate the semiconductor substrate at various stages in another multiple precipitation doping processes in accordance with the present invention.
Figure 9:
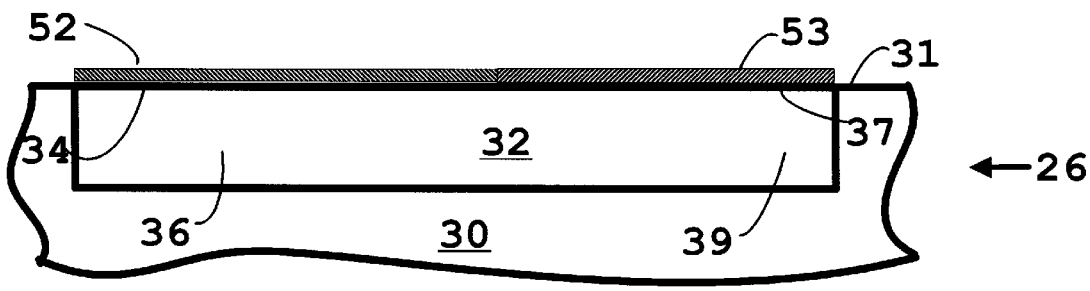
Figure 10:
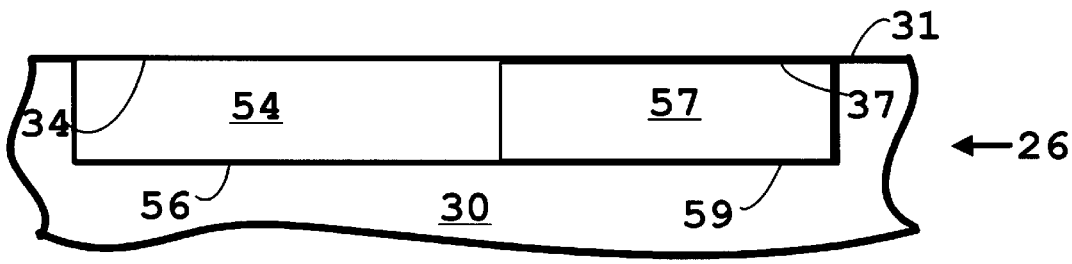

FIGS. 8–10 schematically illustrate the cross sectional views of semiconductor substrate 30 at various stages in a multiple precipitation doping processes in accordance with a second embodiment of the present invention. After forming amorphous regions, e.g., amorphous region 32, in the dies, e.g., die 26, in semiconductor wafer 25 as described supra with reference to FIG. 3, semiconductor wafer 25 is placed on wafer platform 24 in apparatus 20 shown in FIG. 1.

Laser sources 21 and 22 are aligned to a first die, e.g., die 26, in semiconductor wafer 25. A reticle having a first pattern (not shown) is used to pattern laser source 21. The first pattern matches the pattern of a first doped region to be formed in semiconductor substrate 30. The chamber (not shown) enclosing wafer platform 24 is filled with a gas containing a first dopant, e.g., a dopant of N conductivity type. Laser source 21 is switched on to illuminate die 26 while semiconductor wafer 25 is immersed in the first dopant containing gas. Because laser source 21 is masked with the first pattern, only a portion 34 of major surface 31 of semiconductor substrate 30 is exposed the laser beam emitted from laser source 21. Portion 34 of major surface 31 overlies a portion 36 in amorphous region 32. The laser beam causes the N type dopant in the dopant containing gas to precipitate onto portion 34 of major surface 31, thereby forming a first dopant precipitation region or film 52 over portion 34 of major surface 31, as shown in FIG. 8. Preferably, dopant precipitation film 52 is a dopant containing silicate glass layer such as, for example, a phosphorus silicate glass or arsenic silicate glass layer. The surface dopant concentration and film thickness of dopant precipitation film 52 depends on the concentration of the dopant in the gas, the wavelength and intensity of the laser beam emitted from laser source 21, and the time duration of the illumination. When a desired surface dopant deposition is achieved, laser source 21 is switched off. The chamber (not shown) enclosing semiconductor wafer 25 and wafer platform 24 is cleared of the first dopant containing gas.

Another reticle (not shown) with a second pattern replaces the reticle with the first pattern and patterns laser source 21, which is still aligned to die 26 on semiconductor wafer 25. The second pattern matches the pattern of a second doped region to be formed in semiconductor substrate 30. The chamber (not shown) enclosing wafer platform 24 is filled with a gas containing a second dopant, e.g., a dopant of P conductivity type. Laser source 21 is switched on to illuminate die 26 while semiconductor wafer 25 is immersed in the second dopant containing gas. Because laser source 21 is masked with the second pattern, only a portion 37 of major surface 31 of semiconductor substrate 30 is exposed to the laser beam emitted from laser source 21. Portion 37 of major surface 31 overlies a portion 39 of amorphous region 32. The laser beam causes the P type dopant in the dopant containing gas to precipitate onto portion 37 of major surface 31, thereby forming a second dopant precipitation region or film 53 over portion 37 of major surface 31, as shown in FIG. 9. Preferably, dopant precipitation film 53 is a dopant containing silicate glass layer such as, for example, a boron silicate glass layer. The surface dopant concentration and film thickness of dopant precipitation film 53 depends on the concentration of the dopant in the gas, the wavelength and intensity of the laser beam emitted from laser source 21, and the time duration of the illumination. When a desired surface dopant deposition is achieved, laser source 21 is switched off. The second dopant containing gas is purged from the chamber (not shown) enclosing semiconductor wafer 25 and wafer platform 24.

Laser source 22 is switched on to illuminate die 26. Because laser source 22 is not masked, the laser beam emitted from laser source 22 illuminates both portion 34 and portion 37 of major surface 31. The laser beam anneals amorphous region 32 and causes the N type dopant in dopant precipitation film 52 and P type dopant in dopant precipitation film 53 to diffuse into amorphous region 32. Preferably, the diffusion depth is substantially equal to the depth of amorphous region 32. This is easily achievable because amorphous silicon has a significantly lower melting point than single crystal silicon. After annealing, the silicon in portions 36 and 39 of amorphous region 32 crystallize to form an N type doped single crystal silicon region 54 and a P type doped single crystal silicon region 57, respectively, as shown in FIG. 10. An interface 56 between N type doped region 54 and underlying semiconductor substantially coincides with the interface between portion 36 of amorphous region 32 and the underlying single crystal silicon region before the annealing. Likewise, an interface 59 between P type doped region 57 and underlying semiconductor substantially coincides with the interface between portion 37 of amorphous region 32 and the underlying single crystal silicon region before the annealing.

After forming N type doped region 54 and P type doped region 57 in semiconductor substrate 30, laser sources 21 and 22 step to a subsequent die in semiconductor wafer 25. The N type dopant precipitation, the P type dopant precipitation, and diffusion through annealing repeat with respect to the subsequent die to form corresponding N type and P type doped regions in that subsequent die. These stepping, multiple precipitating, and annealing actions continue, thereby forming an N type doped region and a P type doped region all dies in semiconductor wafer 25.

During the process of forming multiple doped regions in a die, e.g., N type doped region 54 and P type doped region 57 in die 26, as shown in FIG. 10, laser sources 21 and 22 do not move with respect to semiconductor wafer 25. The patterns of multiple doped regions in a die are defined in a single step of apparatus 20. Consequently, the alignment mismatch between different doped regions in the die is significantly diminished or substantially eliminated.

In an alternative embodiment, a reticle (not shown) having a first pattern is used to mask laser source 21. The first pattern matches the pattern of a first doped region to be formed in semiconductor substrate 30. The chamber (not shown) enclosing wafer platform 24 is filled with a gas containing a first dopant, e.g., a dopant of N conductivity type. Laser source 21 is aligned to die 26 in semiconductor wafer 25. Laser source 21 is then switched on to illuminate die 26 while semiconductor wafer 25 is immersed in the first dopant containing gas. Because laser source 21 is masked with the first pattern, the laser beam emitted from laser source 21 only illuminates a portion 34 of major surface 31 of semiconductor substrate 30. The laser beam causes the N type dopant in the dopant containing gas to precipitate onto portion 34 of major surface 31, thereby forming a first dopant precipitation film 52 over portion 34 of major surface 31, as shown in FIG. 8. Laser sources 21 then steps to a subsequent die in semiconductor wafer 25, which is still immersed in the N type dopant containing gas. Laser source 21 illuminates the subsequent die to form an N type dopant precipitation region in that subsequent die. These stepping and precipitating actions continue, thereby forming an N type precipitating dopant region over a portion of the major surface in each die in semiconductor wafer 25. The chamber (not shown) enclosing semiconductor wafer 25 is then purged of the N type dopant containing gas.

Laser source 21 is next masked by another reticle (not shown) having a second pattern. The second pattern matches the pattern of a second doped region to be formed in semiconductor substrate 30. The chamber (not shown) enclosing wafer platform 24 is filled with a gas containing a second dopant, e.g., a dopant of P conductivity type. Laser source 21 steps back to its original position and is now aligned to die 26 in semiconductor wafer 25. Laser source 21 is switched on to illuminate die 26 while semiconductor wafer 25 is immersed in the second dopant containing gas. Because laser source 21 is masked with the second pattern, the laser beam emitted from laser source 21 only illuminates a portion 37 of major surface 31 of semiconductor substrate 30. The laser beam causes the P type dopant in the dopant containing gas to precipitate onto portion 37 of major surface 31, thereby forming a second dopant precipitation film 53 over portion 37 of major surface 31, as shown in FIG. 9. Laser sources 21 then steps to a subsequent die in semiconductor wafer 25, which is still immersed in the P type dopant containing gas. Laser source 21 illuminates the subsequent die to form a P type dopant precipitation region in that subsequent die. These stepping and precipitating actions continue, thereby forming a P type precipitating dopant region over a portion of the major surface in each die in semiconductor wafer 25. The chamber (not shown) semiconductor wafer 25 is then purged of the P type dopant containing gas.

After forming N type and P type dopant precipitation regions, e.g., N type dopant precipitation film 52 and P type dopant precipitation film 53 shown in FIG. 9. Semiconductor wafer 25 is annealed. The annealing process causes the N type dopant and the P type dopant in the dopant precipitation regions on the major surface of semiconductor wafer 25 to diffuse into the amorphous regions and crystallizes the silicon in the amorphous regions. Thus, the annealing process forms multiple doped regions in the dies in semiconductor wafer 25, e.g., N type doped region 54 and P type doped region 57 in semiconductor substrate 30, as shown in FIG. 10. In one embodiment, semiconductor wafer 25 is annealed by sequentially illuminating the dies in semiconductor wafer 25 with a laser beam emitted from laser source 22, which is unmasked. In another embodiment, semiconductor wafer 25 is annealed in a rapid thermal annealing (RTA) process by exposing semiconductor wafer 25 to a heat lamp. Semiconductor wafer 25 can also be annealed using an oven. If semiconductor wafer 25 is annealed in an RTA process or using an oven, the multiple precipitation doping process described herein can be performed with an apparatus having only one laser source, but otherwise structurally similar to apparatus 20 shown in FIG. 1.

Referring now to FIGS. 11–14, with reference to which a multiple precipitation doping processes in accordance with a third embodiment of the present invention is described herein below. After forming amorphous regions, e.g., amorphous region 32, in the dies, e.g., die 26, in semiconductor wafer 25 as described supra with reference to FIG. 3, semiconductor wafer 25 is placed on wafer platform 24 in apparatus 20 shown in FIG. 1.

Figure 11:
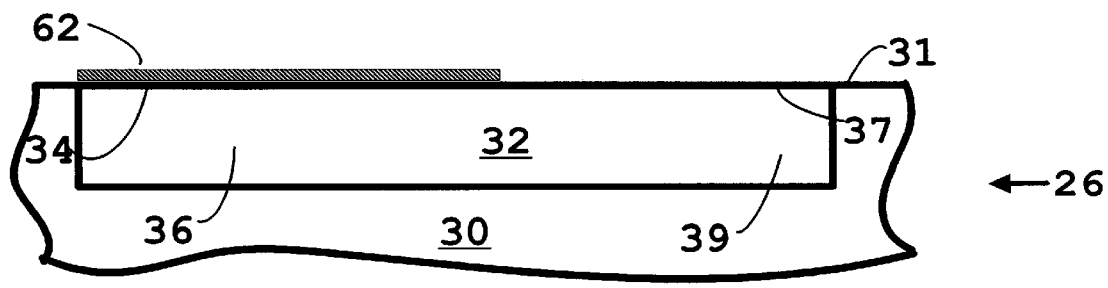
FIGS. 11–14 illustrate the semiconductor substrate at various stages in yet another multiple precipitation doping processes in accordance with the present invention.

A set of reticles (not shown) are used to pattern laser sources 21 and 22. The reticles have a first pattern matching that of a first doped region to be formed in semiconductor substrate 30. The chamber (not shown) enclosing wafer platform 24 is filled with a gas containing a first dopant, e.g., a dopant of N conductivity type. Laser sources 21 and 22 are aligned to a first die, e.g., die 26, in semiconductor wafer 25. Laser source 21 is switched on to illuminate die 26 while semiconductor wafer 25 is immersed in the N type dopant containing gas. Because laser source 21 is masked with the first pattern, the laser beam emitted from laser source 21 only illuminates a portion 34 of major surface 31 of semiconductor substrate 30, which overlies a portion 36 in amorphous region 32. The laser beam causes the N type dopant in the dopant containing gas to precipitate onto portion 34 of major surface 31, thereby forming an N type dopant precipitation region or film 62 over portion 34 of major surface 31, as shown in FIG. 11. Preferably, dopant precipitation film 62 is a dopant containing silicate glass layer such as, for example, a phosphorus silicate glass or arsenic silicate glass layer. When a desired surface dopant deposition is achieved, laser source 21 is switched off.

Figure 12:
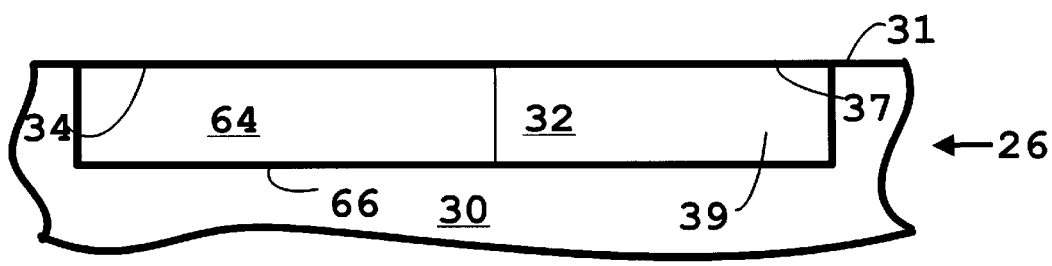

Laser source 22 is next switched on to illuminate die 26. Because laser source 22 is masked with the first pattern, the laser beam emitted from laser source 22 only illuminates portion 34 of major surface 31. The laser beam anneals portion 36 of amorphous region 32 and causes the N type dopant in dopant precipitation film 62 to diffuse into portion 36 of amorphous region 32. The diffusion depth depends on the wavelength, intensity, and time duration of the laser beam emitted from laser source 22. Preferably, the diffusion of the N type dopant preferably propagates to an interface between portion 36 of amorphous region 32 and the underlying single crystal silicon portion of semiconductor substrate 30. This is easily achievable because amorphous silicon has a significantly lower melting point than single crystal silicon. After annealing, the silicon in portion 36 of amorphous region 32 crystallizes to form an N type doped single crystal silicon region 64, as shown in FIG. 12. An interface 66 between N type doped region 64 and underlying semiconductor substantially coincides with the interface between portion 36 of amorphous region 32 and the underlying single crystal silicon region before the annealing.

After forming N type doped region 64 in semiconductor substrate 30, laser sources 21 and 22 step to a subsequent die in semiconductor wafer 25. The N type dopant precipitation and diffusion through annealing repeat with respect to the subsequent die to form a corresponding N type doped region in that subsequent die. These stepping, precipitating, and annealing actions continue, thereby forming an N type doped region in each die in semiconductor wafer 25.

Figure 13:
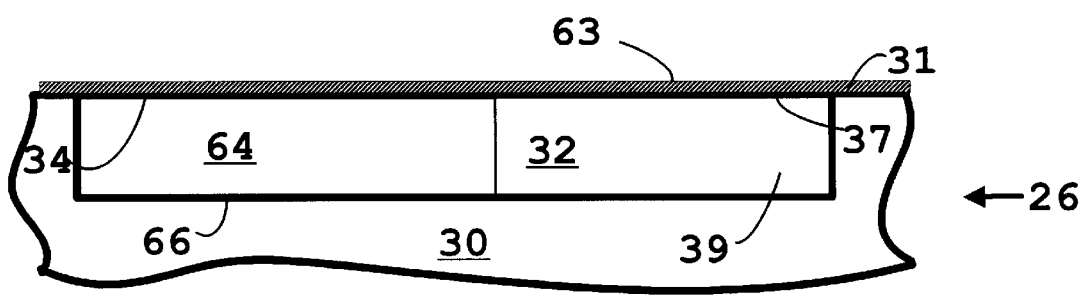

Laser sources 21 and 22 are unmasked. The chamber (not shown) enclosing semiconductor wafer 25 is next filled with a gas containing a second dopant, e.g., a dopant of P conductivity type. Laser source 21 steps back to the original position and is aligned to die 26 in semiconductor wafer 25. Laser source 21 is switched on to illuminate die 26 while semiconductor wafer 25 is immersed in the second dopant containing gas. Because laser source 21 is unmasked, both portion 34 and portion 37 of major surface 31 of semiconductor substrate 30 are exposed to the laser beam emitted from laser source 21. Portion 34 of major surface 31 overlies N type doped region 64 and portion 37 of major surface 31 overlies a portion 39 of amorphous region 32. The laser beam causes the P type dopant in the dopant containing gas to precipitate onto major surface 31, thereby forming a second dopant precipitation region or film 63 over major surface 31, as shown in FIG. 13. Preferably, dopant precipitation film 63 is a dopant containing silicate glass layer such as, for example, a boron silicate glass layer. The surface dopant concentration and film thickness of dopant precipitation film 63 depends on the concentration of the dopant in the gas, the wavelength and intensity of the laser beam emitted from laser source 21, and the time duration of the illumination. When a desired surface dopant deposition is achieved, laser source 21 is switched off. After forming P type dopant precipitation film 63, laser sources 21 steps to a subsequent die in semiconductor wafer 25, which is still immersed in the P type dopant containing gas. Laser source 21 is switched on to form a P type dopant precipitation region in that subsequent die. These stepping and precipitating actions continue, thereby forming a P type dopant precipitation region over the major surface of each die in semiconductor wafer 25. The chamber (not shown) enclosing semiconductor wafer 25 is purged of the P type dopant containing gas.

Figure 14:
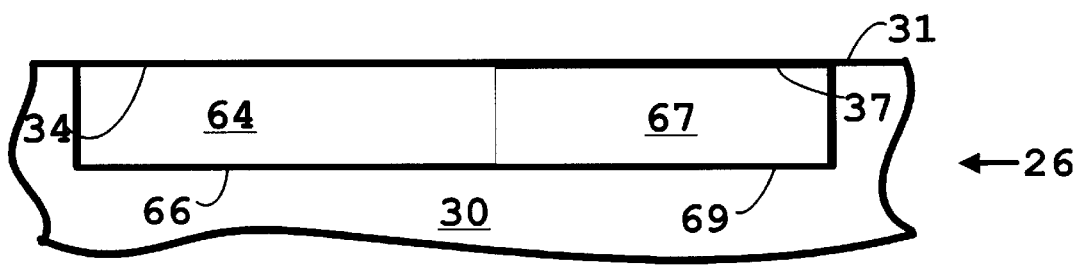

Semiconductor wafer 25 is then annealed. In one embodiment, semiconductor wafer 25 is annealed by sequentially illuminating the dies in semiconductor wafer 25 with a laser beam emitted from laser source 22, which is unmasked. In another embodiment, semiconductor wafer 25 is annealed in an RTA process by illuminating semiconductor wafer 25 with a heat lamp. In yet another embodiment, semiconductor wafer 25 is annealed in an oven. During the annealing process, the P type dopant in the P type dopant precipitation regions diffuse into portions of semiconductor wafer 25 which are still amorphous. For example in die 26, the P type dopant diffuses into portion 39 of amorphous region 32. The silicon in N type doped region 64 (shown in FIGS. 12 and 13) in semiconductor substrate 30 is already crystallized earlier when semiconductor substrate 30 is exposed to the masked laser beam from laser source 22. Therefore, the annealing process substantially has no effect on N type doped region 64. The annealing process also crystallizes the silicon in portion 39 of amorphous region 32, thereby forming P type doped region 67, as shown in FIG. 14. An interface 69 between P type doped region 67 and underlying semiconductor substantially coincides with the interface between portion 37 of amorphous region 32 and the underlying single crystal silicon region before the annealing. Therefore, multiple doped regions are formed in the dies in semiconductor wafer 25.

It should be noted that the multiple precipitation doping process of the present invention is not limited to those described herein before. For example, forming amorphous region 32 in semiconductor substrate 30 is optional. In a process of doping semiconductor substrate 30 without forming amorphous region 32, the junction depth is determined by the temperature and duration of the annealing process. If laser source 22 (shown in FIG. 1) is used for annealing semiconductor substrate 30, the intensity, frequency, pulsating rate, and duration of a laser beam emitted form laser source 22 will determine the junction depth. Further, an annealing process separated from the precipitation process is optional in accordance with the present invention. In an alternative embodiment, the laser beam emitted from laser source 21 (shown in FIG. 1) precipitates dopants on major surface 31 of semiconductor substrate 30 and melting an upper portion of semiconductor substrate 30, thereby causing the dopants to diffuse into the upper portion of semiconductor substrate 30. In this embodiment, dopant precipitation, dopant diffusion, and semiconductor substrate annealing are achieved in a single laser illumination step. In an additional alternative embodiment, dopants or doped silicon can be precipitated on major surface 31 of semiconductor substrate 30 using a laser induced chemical vapor deposition process.

By now it should be appreciated that a multiple precipitation doping process has been provided. In accordance with the present invention, the dopant precipitation is accomplished in a multiple exposure PGILD process by illuminating the semiconductor substrate with masked laser beams while the semiconductor substrate is immersed in dopant containing gases, thereby eliminating the need for depositing, developing, and stripping photoresist masks. In a preferred embodiment, the multiple precipitation doping process includes the steps of forming an amorphous region partially extending into a single crystal semiconductor substrate; precipitating different dopants onto respective portions of the major surface of the semiconductor substrate; and annealing the amorphous region. The annealing process melts the amorphous region and allows the dopants precipitated on the semiconductor substrate major surface to diffuse into the semiconductor substrate. The annealing process also crystallizes the amorphous region. Thus, the semiconductor substrate becomes a single crystal semiconductor substrate with multiple doped regions therein. The junction depth of the doped regions is substantially determined by the depth of the amorphous regions before annealing and is independent of dopant density. Therefore, the multiple precipitation doping process of the present invention is capable of forming doped regions with high dopant density and shallow junction depth. The doping process of present invention is simple and efficient. It is compatible with the fabrication of high performance submicron semiconductor devices.

What is claimed is:

1. A multiple precipitation doping process, comprising the steps of:
   providing a semiconductor substrate having a major surface;
   precipitating a first dopant onto a first portion of the major surface;
   precipitating a second dopant onto a second portion of the major surface after precipitating the first dopant onto the first portion of the major surface;
   annealing a first portion of the semiconductor substrate underlying the first portion of the major surface; and
   annealing a second portion of the semiconductor substrate underlying the second portion of the major surface.

2. The multiple precipitation doping process of claim 1, further comprising the step of forming an amorphous region extending from the major surface of the semiconductor substrate partially into the semiconductor substrate, wherein the first portion and the second portion of the major surface overlie a first portion and a second portion, respectively, of the amorphous region.

3. The multiple precipitation doping process of claim 1, wherein the step of
   precipitating a first dopant includes the steps of:
   immersing the semiconductor substrate in a gas containing the first dopant;
   masking a first laser beam with a first pattern; and
   illuminating the first portion of the major surface with the first laser beam.

4. The multiple precipitation doping process of claim 3, wherein the step of annealing a first portion of the semiconductor substrate is performed before precipitating the second dopant onto the second portion of the major surface and includes the steps of:
   masking a second laser beam with the first pattern; and
   illuminating the first portion of the major surface with the second laser beam.

5. The multiple precipitation doping process of claim 4, wherein the step of
   precipitating a second dopant includes the steps of:
   immersing the semiconductor substrate in a gas containing the second dopant; and
   illuminating, at least partially, the major surface with a third laser beam.

6. The multiple precipitation doping process of claim 5, wherein the step of
   illuminating, at least partially, the major surface further includes the steps of:
   masking the third laser beam with a second pattern; and
   illuminating the second portion of the major surface with the third laser beam.

7. The multiple precipitation doping process of claim 5, wherein the step of illuminating, at least partially, the major surface further includes illuminating the first portion and the second portion of the major surface with the third laser beam.

8. The multiple precipitation doping process of claim 5, wherein the step of annealing a second portion of the semiconductor substrate includes illuminating, at least partially, the major surface with a fourth laser beam.

9. The multiple precipitation doping process of claim 8, wherein the step of illuminating, at least partially, the major surface with a fourth laser beam further includes the steps of:
   masking the fourth laser beam with a second pattern; and
   illuminating the second portion of the major surface with the fourth laser beam.

10. The multiple precipitation doping process of claim 8, wherein the step of illuminating, at least partially, the major surface with a fourth laser beam further includes illuminating the first portion and the second portion of the major surface with the fourth laser beam.

11. The multiple precipitation doping process of claim 3, wherein the step of annealing a first portion of the semiconductor substrate includes annealing the first portion of the semiconductor substrate after precipitating the second dopant onto the second portion of the major surface.

12. The multiple precipitation doping process of claim 11, wherein the step of precipitating a second dopant includes the steps of:
 immersing the semiconductor substrate in a gas containing the second dopant;
 masking a second laser beam with a second pattern; and
 illuminating the second portion of the major surface with the second laser beam.

13. The multiple precipitation doping process of claim 12, wherein the steps of annealing a first portion of the semiconductor substrate and annealing a second portion of the semiconductor substrate include illuminating first portion and the second portion of the major surface with a third laser beam to anneal the first portion and the second portion of the semiconductor substrate simultaneously.

14. The multiple precipitation doping process of claim 1, wherein the steps of annealing a first portion of the semiconductor substrate and annealing a second portion of the semiconductor substrate include annealing the semiconductor substrate in a rapid thermal annealing process.

15. A doping process, comprising the steps of:
 providing a semiconductor wafer having a plurality of dies therein; and
 sequentially doping the plurality of dies in the semiconductor wafer, wherein doping a die of the plurality of dies includes the steps of:
  precipitating a first dopant onto a first portion of a major surface of the semiconductor wafer in the die;
  annealing a first portion of the semiconductor wafer underlying the first portion of the major surface in the die;
  precipitating a second dopant onto a second portion of the major surface in the die; and
  annealing a second portion of the semiconductor wafer underlying the second portion of the major surface in the die.

16. The doping process of claim 15, further comprising the step of forming a plurality of amorphous regions in the plurality of dies, the plurality of amorphous regions extending from the major surface of the semiconductor wafer partially into the semiconductor wafer, an amorphous region in a die underlying the first portion and the second portion of the major surface in the die.

17. The doping process of claim 15, wherein:
 the steps of precipitating a first dopant and annealing a first portion of the semiconductor wafer include the steps of:
  aligning a first laser source and a second laser source to the die;
  masking the first laser source with a first pattern;
  exposing the major surface to a laser beam emitted from the first laser source while immersing the semiconductor wafer in a gas containing the first dopant;
  masking the second laser source with the first pattern; and
  exposing the major surface to a laser beam emitted from the second laser source; and
 the steps of precipitating a second dopant and annealing a second portion of the semiconductor wafer include the steps of:
  masking the first laser source and the second laser source with a second pattern;
  exposing the major surface to a laser beam emitted from the first laser source while immersing the semiconductor wafer in a gas containing the second dopant; and
  exposing the major surface to a laser beam emitted from the second laser source.

18. The doping process of claim 17, the wherein step of sequentially doping the plurality of dies further includes aligning the first laser source and the second laser source to a subsequent die of the plurality of dies after annealing the second portion of the semiconductor wafer underlying the second portion of the major surface in the die.

19. A process for doping a semiconductor wafer having a plurality of dies, comprising the steps of:
 forming a plurality of amorphous regions in the plurality of dies and extending from a major surface of the semiconductor wafer partially into the semiconductor wafer;
 precipitating a first dopant onto a first plurality of portions of the major surface overlying a first plurality of portions of the plurality of amorphous regions in the plurality of dies;
 precipitating a second dopant onto a second plurality of portions of the major surface overlying a second plurality of portions of the plurality of amorphous regions in the plurality of dies; and
 annealing the plurality of amorphous regions in the plurality of dies in the semiconductor wafer.

20. The process as claimed in claim 19, wherein the step of annealing the plurality of amorphous regions includes annealing the semiconductor wafer in a rapid thermal annealing process.

21. The process as claimed in claim 19, wherein the step of annealing the plurality of amorphous regions includes sequentially exposing portions of the major surface overlying the plurality of amorphous regions in the plurality of dies in the semiconductor wafer to a laser beam.

22. The process as claimed in claim 19, wherein the steps of precipitating a first dopant and precipitating a second dopant further include the steps of:
 aligning a laser source to a die of the plurality of dies in the semiconductor wafer;
 masking the laser source with a first pattern;
 exposing a portion of the first plurality of portions of the major surface overlying a first portion of an amorphous region in the die to the laser source while immersing the semiconductor wafer in a gas containing the first dopant;
 masking the laser source with a second pattern;
 exposing a portion of the second plurality of portions of the major surface overlying a second portion of the amorphous region in the die to the laser source while immersing the semiconductor wafer in a gas containing the second dopant;
 aligning the laser source to a subsequent die of the plurality of dies in the semiconductor wafer; and
 repeating the steps of masking the laser source with a first pattern, exposing a portion of the first plurality of portions of the major surface overlying a first portion of an amorphous region to the laser source, masking the laser source with a second pattern, and exposing a portion of the second plurality of portions of the major surface overlying a second portion of the amorphous region to the laser source with respect to the subsequent die.

23. The process as claimed in claim 19, wherein the step of precipitating a first dopant includes the steps of:
   immersing the semiconductor wafer in a gas containing the first dopant;
   masking a laser source with a first pattern;
   aligning the laser source to a die of the plurality of dies in the semiconductor wafer;
   exposing a portion of the first plurality of portions of the major surface overlying a first portion of an amorphous region in the die to the laser source;
   aligning the laser source to a subsequent die of the plurality of dies in the semiconductor wafer; and
   exposing a portion of the first plurality of portions of the major surface overlying a first portion of an amorphous region in the subsequent die to the laser source.

24. The process as claimed in claim 23, wherein the step of precipitating a second dopant includes the steps of:
   immersing the semiconductor wafer in a gas containing the second dopant;
   masking the laser source with a second pattern;
   aligning the laser source to the die of the plurality of dies in the semiconductor wafer;
   exposing a portion of the second plurality of portions of the major surface overlying a second portion of the amorphous region in the die to the laser source;
   aligning the laser source to the subsequent die of the plurality of dies in the semiconductor wafer; and
   exposing a portion of the second plurality of portions of the major surface overlying a second portion of the amorphous region in the subsequent die to the laser source.

25. A method for doping a semiconductor wafer, comprising the steps of:
   forming a plurality of amorphous regions in a plurality of dies in the semiconductor wafer and extending from a major surface of the semiconductor wafer partially into the semiconductor wafer;
   sequentially doping the plurality of dies with a first dopant, wherein doping a die of the plurality of dies with the first dopant includes the steps of:
      aligning a first laser source and a second laser source to the die;
      masking the first laser source;
      precipitating the first dopant onto a portion of the major surface overlying a first portion of an amorphous region in the die by illuminating the portion of the major surface with the first laser source while immersing the semiconductor wafer in a gas containing the first dopant;
      masking the second laser source; and
      annealing the first portion of the amorphous region in the die by illuminating the portion of the major surface with the second laser source;
   precipitating a second dopant onto the major surface of the semiconductor wafer; and
   annealing the semiconductor wafer.

26. The method as claimed in claim 25, wherein the step of sequentially doping the plurality of dies further includes aligning the first laser source and the second laser source to a subsequent die of the plurality of dies and repeating the precipitating step and annealing step with respect to the subsequent die.

27. The method as claimed in claim 25, wherein the step of precipitating a second dopant onto the major surface of the semiconductor wafer further includes the steps of:
   unmasking the first laser source;
   immersing the semiconductor wafer in a gas containing the second dopant; and
   illuminating the major surface with the first laser source.

28. The method as claimed in claim 27, wherein the step of illuminating the major surface with the first laser source includes sequentially illuminating a plurality of portions of the major surface overlying the plurality of amorphous regions in the plurality of dies with the first laser source.

29. The method as claimed in claim 25, wherein the step of annealing the semiconductor wafer includes the steps of:
   unmasking the second laser source; and
   sequentially illuminating a plurality of portions of the major surface overlying the plurality of amorphous regions in the plurality of dies with the second laser source.

30. The method as claimed in claim 25, wherein the step of annealing the semiconductor wafer includes the step of illuminating the semiconductor wafer with a heat lamp to anneal the semiconductor wafer in a rapid thermal annealing process.

* * * * *